United States Patent [19]

Nigh et al.

[11] 4,079,169
[45] Mar. 14, 1978

[54] COBALT BASE ALLOY AS PROTECTIVE LAYER FOR MAGNETIC RECORDING MEDIA

[75] Inventors: Max Thomas Nigh, Los Altos; Ronald Allan Ross; Armin Rudolf Tietze, both of San Jose, all of Calif.

[73] Assignee: International Business Machines Corporation, Armonk, N.Y.

[21] Appl. No.: 742,163

[22] Filed: Nov. 15, 1976

[51] Int. Cl.² .......................... B32B 15/00; G11B 5/00
[52] U.S. Cl. .................................... 428/636; 360/134; 428/652; 428/668; 428/678; 428/679; 428/928
[58] Field of Search .............. 428/611, 928, 678, 652, 428/636, 668, 679; 230/134

[56] References Cited

U.S. PATENT DOCUMENTS

| 3,418,111 | 12/1968 | Herchenroeder | 75/171 |
| 3,471,272 | 10/1969 | Wilhelm et al. | 428/928 |
| 3,520,664 | 7/1970 | York | 428/621 |
| 3,702,239 | 11/1972 | Nagy et al. | 428/652 |
| 3,751,345 | 8/1973 | Wilhelm et al. | 428/652 |

Primary Examiner—Arthur J. Steiner
Attorney, Agent, or Firm—James A. Pershon

[57] ABSTRACT

A magnetic recording media is manufactured by depositing a nonmagnetic cobalt base alloy onto a substrate preferably aluminum as a protective layer for the substrate. The cobalt alloy includes chromium, tungsten, and nickel. The clad protective layer can be deposited in several steps with or without a polishing between the deposition steps to provide better corrosion protection for the substrate and covers surface imperfections of the substrate. The cobalt alloy is preferably sputtered onto the prepared substrate.

12 Claims, 3 Drawing Figures

COBALT BASE ALLOY AS PROTECTIVE LAYER FOR MAGNETIC RECORDING MEDIA

BACKGROUND OF THE INVENTION

This invention relates generally to a magnetic recording media and in particular to a record carrier wherein a clad protective layer is deposited on a substrate prior to the magnetic layer.

1. Field of the Invention

Magnetic recording media having thin films of a magnetizable metal or alloys thereof have found a usage in electronic data processing equipment as high storage capacity memories. Various forms of the substrate base such as films, drums, wires or disks are commonly used. The thin film metal-plated magnetic recording media permits a higher storage capacity from the usual iron oxide recording media.

Generally the magnetic layer is deposited on a substrate that is easily machinable such as an aluminum disk. But aluminum is soft and contains impurities that hinder fabricating the perfectly smooth surface required for the magnetic layer and a low flying magnetic recording transducer. Further, a galvanic action can occur between the aluminum substrate and the thin film magnetizable layer if the magnetizable layer is deposited directly onto the aluminum. The galvanic action causes a corrosion of the subsequent layer and with the magnetic layer causes recording errors. Thus, a clad layer is normally deposited onto the substrate before the magnetic layer to provide wear resistance and mechanical rigidity to the aluminum material, to provide an easily polishable layer for smoothness, and to protect the aluminum from corrosion. The protective layer together with any other undercoat layers such as a chromium layer should enhance the coercivity and other magnetic properties of the overlying magnetic thin film layer.

2. Prior Art

It is well known to insert a metal film between a substrate and a ferromagnetic material layer. It is also known as shown in U.S. Pat. No. 3,520,664 to D. P. York that a plurality of layers can be deposited intermediate the substrate and the magnetic layer. As with all of the prior art, the intent is to overcome the impurities in the substrate, to prevent galvanic action between the substrate and the magnetic layer, and to provide mechanical rigidity.

It is, therefore, an object of the present invention to provide a magnetic disk structure and a process for making a magnetic disk wherein the protective layer covers any asperities in the substrate, prevents galvanic action between the magnetic layer and the substrate, and provides a mechanical rigidity to the structure and allows for smoothing any asperities in the substrate.

SUMMARY OF THE INVENTION

In accordance with the present invention, a cobalt based alloy sometimes known as a super alloy is deposited on a substrate preferably composed of an aluminum or aluminum alloy material. The specific cobalt based alloy layer is non-magnetic. An undercoat layer may be deposited on the cobalt based alloy isolation layer. A magnetic medium is then deposited having suitable magnetic properties for use as a magnetic recording member. A protective layer may then be deposited over the magnetic layer.

The cobalt based alloy consists of 18–30% chromium, from 8–18% tungsten, from 8–30% nickel, with the balance being cobalt. Other materials may be included of a composition of less than 10%. The lesser constituents are uniformly dispersed in the cobalt based alloy and thus constitute a minor role in the function of the isolation layer.

The process for making the magnetic recording medium comprises the steps of providing a substrate of a suitable and shape for the recording member, preparing a smooth surface on the substrate, depositing a cobalt based alloy on the prepared substrate, polishing the cobalt based alloy if necessary, and depositing a magnetic layer on the cobalt based alloy isolation layer. An undercoat layer may be inserted between the isolation layer and the magnetic layer. Further, a layer of a hard material may be provided on the magnetic layer to prevent damage to the magnetic layer.

An object of the present invention, therefore, is to provide an enhanced magnetic recording media.

Another object of the present invention is to provide an enhanced process for manufacturing a magnetic recording media wherein the cobalt based alloy is vacuum deposited on a substrate as a base layer for a subsequent magnetic material layer.

Yet another object is to provide a clad isolation layer for a magnetic recording media having an aluminum substrate wherein the cladding layer is comprised of a vacuum deposited cobalt based alloy.

These and other objects of the present invention will become apparent to those skilled in the art as the description proceeds.

BRIEF DESCRIPTION OF THE DRAWING

The various novel features of this invention, along with the foregoing other objects, as well as the invention itself both as to its organization and method of operation, may be fully understood from the following description of illustrated embodiments when read in conjunction with the accompanying drawing wherein.

DESCRIPTION OF THE PREFERRED EMBODIMENTS

Figure 1:
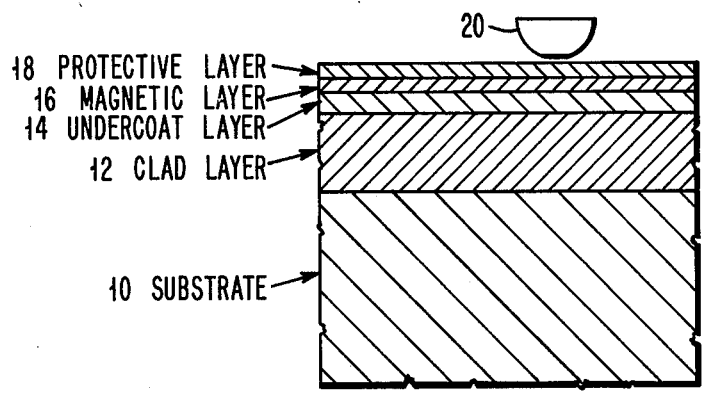
FIG. 1 is a cross-sectional view of the layers of a typical magnetic recording member including the clad layer of the instant invention.

In accordance with the invention, there is provided in FIG. 1 a cross-sectional view of a magnetic recording member. The member comprises a substrate 10 onto which a clad isolation layer 12 is vacuum deposited. An undercoat layer 14 may be superimposed over the clad isolation layer 12. Magnetic film layer 16 is deposited next to provide a magnetic recording media. A hard finish protective layer 18 may be provided on the magnetic film layer for protection of the magnetic material during usage such as when in contact with a magnetic transducing head 20 during relative motion or especially during start up or shutdown operations when head-disk separation is not provided by the air bearing film.

Generally the substrate 10 is comprised of a metal such as aluminum or an aluminum alloy, especially when the magnetic recording member is in the form of a disk. The use of aluminum as a substrate provides certain advantages since aluminum is light for easy handling and strong for rigidity, and is easily annealed to achieve the desired flatness. With its lightweight, aluminum has a low inertia and can be quickly accelerated or decelerated. Further, aluminum can be finished to provide a smooth surface for the subsequent layers. Generally an aluminum alloy containing a small amount of magnesium is used. A suitable alloy is 5086 aluminum magnesium alloy or one having similar mechanical properties.

With aluminum as the substrate, an isolation layer must be formed between the aluminum and the subsequent magnetic layer to prevent a galvanic action between the substrate and the magnetic material. Galvanic action promotes corrosion which will cause loss of magnetic material at the surface of the recording media and cause information bit dropout. Further, there are impurities in the aluminum such as iron and bismuth that are harder than the aluminum material. These defects need to be covered by the clad layer. THe clad layer 12 eliminates imperfections by completely covering the non-magnetic substrate 10 with a corrosion constituent layer which may be smoothed by subsequent polishing, if necessary. Also, aluminum is a fairly soft material and must be made resistant to damage caused from impact with the magnetic transducing head 20. Thus, the clad isolation layer 12 is deposited on the aluminum substrate 10.

The clad isolation layer 12 must be non-magnetic after deposition onto the substrate. It has been found that a cobalt based super alloy after depositing by a vacuum deposition process such as sputtering is non-magnetic while providing the required isolation properties. The best alloy according to the present invention contains chromium, tungsten and nickel together with cobalt. The function of the cobalt and the chrome is believed to give the best corrosion resistance between the substrate and the subsequent layers. The tungsten provides a hardness and mechanical rigidity to make the substrate more resistant to damage from the head impact. The nickel contributes ductility to the material. The preferred deposition process is sputtering. It is not known why this material is non-magnetic after sputtering. The clad isolation layer should be non-magnetic after deposition to prevent competition with the magnetic layer. Most stainless steels such as 316 and 304 stainless steels become magnetic after deposited by the sputtering process. Carpenter's steel likewise becomes magnetic after deposition. The surprise was that the cobalt based alloy did not similarly become magnetic after deposition.

A commercially available alloy such as Haynes alloy 188 or 25 are acceptable cobalt based alloys for the clad isolation layer 12 of the present invention. The cobalt based alloy comprising the clad isolation layer 12 consists of from 18–30% chromium, from 8–18% tungsten, from 8–30% nickel, with the balance being cobalt. Other materials may be included of a composition of less than 10% The lesser constituents do not play any known role because, after deposition by a vacuum process, the materials are uniformly dispersed. Haynes alloy 188 is the subject of U.S. Pat. No. 3,418,111 issued to R. B. Herchenroder on Dec. 24, 1968.

EXAMPLE 1

The Haynes alloy 188 material was deposited on a prepared aluminum alloy substrate by sputtering in a vacuum chamber with argon gas at a pressure of 3 × $10^{-3}$ Torr. The substrate temperature was maintained at 100°–250° C. The cobalt based alloy was deposited at a rate of 10 Angstroms per second to a thickness of 40,000 Angstroms. The percentages of the major materials from the bulk target material prior to deposition and from the thin film are given below.

| Target Material | Deposited Film |
|---|---|
| Co - 38.31% | Co - 37.83% |
| Ni - 22.86% | Ni - 24.23% |
| Cr - 21.95% | Cr - 21.76% |
| W - 14.50% | W - 14.45% |
| Fe - 1.19% | Fe - 1.04% |

The minor constituents such as carbon, silicon and lathanum were not checked but were assumed to be of the same percentage in the deposited film as the target material. As shown in Example 1, the deposited film has a composition that is very close to that of the bulk material and thus can be said to have the same advantages, better corrosion resistance, hardness, ductility, wear resistance and capability of being polished to a smooth finish.

Further, the percentage range of the alloy as stated in the patent for the bulk material should present similar results as taught by that patent.

EXAMPLE 2

A second commercially available cobalt based alloy, Haynes alloy 25, was deposited on a prepared aluminum alloy using the same procedure as for Example 1. The target bulk material according to the manufacturer had the ranges of materials as listed. The final deposited film is assumed to have the same percentages of the major metals as listed for the target material based in Example 1 and other analysis made on the deposited film.

Target Material

Ni - 9 - 11%
Cr - 19 - 21%
W - 14 - 16%
Fe - 3%
C - 0.05 - 0.15%
Si - 1%
Mn - 1 - 2%
Co - Balance The clad layer deposited according to Example 2 had the same advantage as for Example 1, better corrosion resistance, hardness, ductility, wear resistance and polishability characteristics.

From the examples, the major metals have a range of Co 35 – 50%, Ni 10–22%, Cr 18–25%, W 13–16%. Both examples yielded a protective layer that provided corrosion resistance and a smooth-hard surface for the subsequent layers.

A wide range of conditions produced no cracking and a high gloss using the Haynes alloy 188 material and the Haynes alloy 25 material under the conditions of argon pressure of from 2 to 30 microns, a temperature range from ambient to 300° C, and a deposition thickness of up to 50 microns. The stainless steel 316 under a high sputtering rate produces cracks at ambient temperature and 2 microns thickness. The Inconel 625 alloy produced cracks when deposited at 15 microns of argon pressure and the surface became rough at 4 microns argon pressure at a 3 microns thickness. Carpenter steel 20CB3 when sputtered showed rough surfaces at a rather low argon pressure and in a thin coating.

The cobalt-based superalloys are generally used in applications requiring high temperature strength and oxidation resistance. These alloys remain non-magnetic after sputtering. The cobalt-based alloys enhance the magnetic properties of the magnetic layer of the magnetic record carrier. The composition and crystallographic structure of the alloy, although it has four major constituents including tungsten, remains constant upon vacuum deposition. Thus the desirable properties of the bulk material should remain in the thin film layer.

The high reflectivity of the material after vacuum deposition is apparently independent of the film thickness which implies no uncontrolled crystal growth during deposition. The cobalt-based alloy can be polished to a smooth surface finish after sputtering and thereby can be deposited to a thickness sufficient to eliminate imperfections of the substrate layer.

The cobalt based alloy clad layer enhances the magnetic properties of the magnetic layer, especially the coercivity. If a nucleation layer is desired, a separate undercoat layer 14 of chromium or titanium may be deposited onto the clad isolation layer 12. The undercoat layer 14 is not absolutely necessary. It is well known that a nucleation layer, such as the undercoat layer 14, beneath the magnetic layer 16 decreases the stresses developed in the deposited magnetic film. While no underlying theory is proposed as to why these stresses occur, it may be hypothecated that, because of the high surface mobilities required for the deposited material to nucleate and thus form a continuous film, large energies and nucleating times are needed for crystallization thereof. The clad layer 12 provides these properties for the magnetic layer and the undercoat layer 14 may be inserted to decrease the stresses and further enhance the magnetic properties of the magnetic layer. The undercoat layer 14 may be inserted to possibly decrease the stresses and provide potentially better adhesion for the magnetic layer 16. As disclosed in the above-mentioned U.S. Pat. No. 3,520,664, the undercoat layer 14 may be selected from a group of materials such as Ag, Cr, Co, Ta, Fe, Au, Cu, Ni, V and Ti. The preferred material in the present invention is titanium or chromium. A vacuum deposition process such as sputtering is preferred for the deposition of the undercoat layer.

Superimposed next is the magnetic film layer 16. The magnetic layer may comprise iron or cobalt or an alloy thereof preferably vacuum deposited. The magnetic properties of the magnetic film layer must be such that the thin film is suitable as the high density magnetic recording member. The magnetic properties of the magnetic film layer are a function of the materials, the film thickness, the angle of deposition and the underlying substrate materials. The coercivity and squareness magnetic properties are especially important in magnetic recording.

After the deposition of the magnetic film layer 16, the hard finish protective layer 18 may be deposited to form a protective layer for the magnetic material. The protective layer 18 can be a precious metal material such as rhodium. The protective layer provides a hard external surface for the storage member to protect the magnetic film layer 16 from being removed or damaged during any contact of the recording member with the transducing head 20. As will be appreciated, the transducing head 20 is generally separated by only a few tenths of a micron from the storage member. There is a possibility that the head may contact the recording member and remove or damage the magnetic film layer 16 without the protection of the protective layer 18. The protective layer 18 of rhodium provides the separation between the transducing head and the magnetic film 16 but is not necessary if the air film producing the flying of the transducer head 20 is never dissipated such as in a memory system where the disk is continuingly revolving, or the transducing head is removed prior to the stopping of the rotation of the disk.

Figure 2:
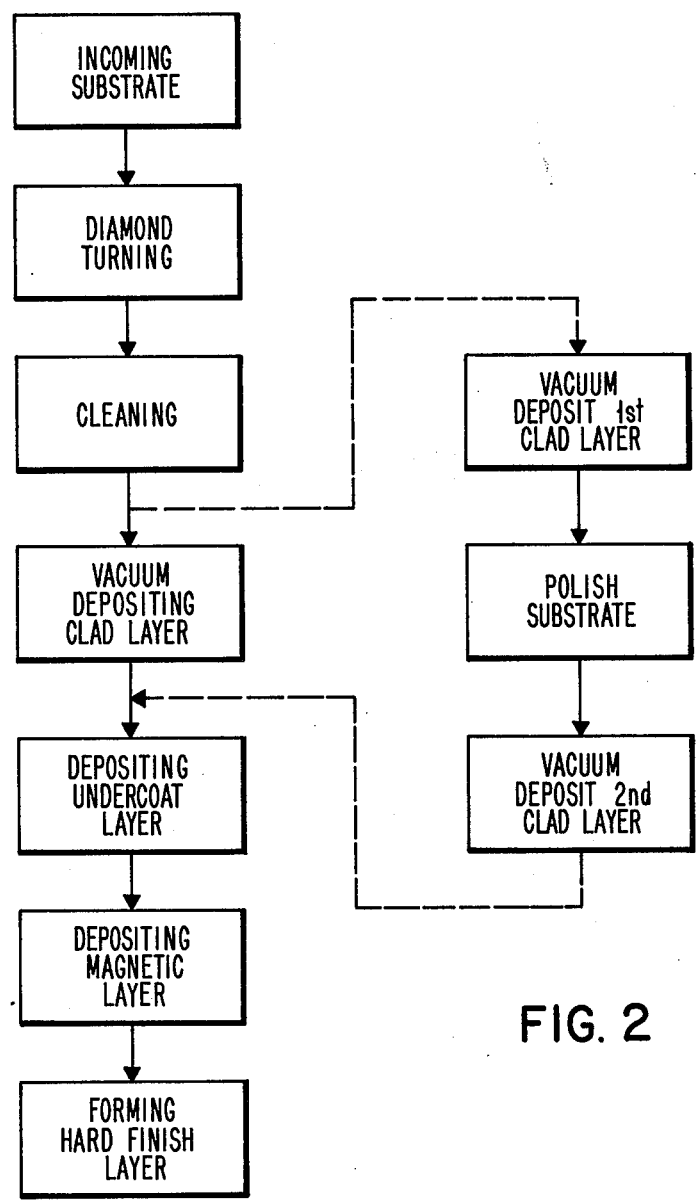
FIG. 2 is a flow chart representing various steps of the invention utilizing the formation of a magnetic recording member.

FIG. 2 shows the major process steps involved in the fabrication of the magnetic recording member. Referring to FIG. 2, the surfaces of the disk substrate 10 are diamond turned to provide an extremely smooth surface to eliminate spikes or other sharp discontinuities and to provide the desired uniform smoothness for operation with the closely spaced flying head 20. The finishing by diamond turning produces an extremely flat surface which may be further polished or not as desired.

The finished aluminum substrate is next cleaned to remove any material or chips left on a surface of the substrate after the finishing operation. The cleaning may include an etching step such as by the well known sputter etching process to prepare the substrate 10 for the clad layer 12 which is deposited preferably by a sputter deposition process.

After the thorough cleaning, the substrate 10 is prepared further by the vacuum deposition of the clad layer 12 of the present invention. The cobalt based alloy for the clad layer is deposited by the sputtering process in a vacuum chamber at a pressure of about $3 \times 10^{-3}$ Torr. During the deposition of the cobalt based alloy, the substrate is maintained at a temperature between 40° to 300° C, but preferably at a temperature of 250° C. The cobalt based alloy is deposited at a rate of about 5 to 40 Angstroms per second to a thickness between 20,000 to 100,000 Angstroms but preferably in the range of 40,000 Angstroms.

The cobalt based clad layer of the present invention provides the further advantage in that it can be easily polished to a smooth surface finish after the vapor deposition process. Further, the clad isolation layer may be deposited as two separate layers using the cobalt based alloy for the vacuum deposition process with a polishing step between the deposition of the two layers. The deposition of the total clad layer in two steps with the polishing step in between significantly reduces the occurrence of pinholes. The preferred polishing between the two layers is by free abrasive polishing procedure. The intermediate polishing step influences the degree of existing pinholes covered by a second coat. The surface texture produced by the polishing step seems to be the influencing factor.

Still referring to FIG. 2, the next step is the provision of a thin film undercoat layer if desired. The non-magnetic undercoat layer is deposited over the clad isolation layer if a nucleation layer is desired. A thin film of titanium or chromium preferably is sputter deposited on the clad isolation layer to a thickness of the order of 250 to 1000 Angstroms. It has been found though that the undercoat layer is not required if the clad layer is the cobalt based alloy of the present invention. The deposition of the undercoat layer is accomplished by sputter deposition in a vacuum chamber at an Argon pressure of about $3 \times 10^{-3}$ Torr. The rate of deposition is approximately 8 Angstroms per second and the substrate temperature is approximately 150° C.

The magnetic layer 16 is next deposited preferably by vacuum deposition such as E-beam evaporation or sputtering. The magnetic layer can comprise iron or cobalt material or an alloy of iron and cobalt. Or, the magnetic layer 16 can comprise a vacuum deposited chromium-chromium oxide material as taught in U.S. Pat. No. 3,498,837, patented Mar. 3, 1970 to J. K. Alstead et al and assigned to the assignee of the present invention. In that patent a suitable source of chromium is heated in a vacuum pressure of about $10^{-4}$ Torr to cause evaporation. A coating of 1250 to 2500 Angstroms was found to be sufficient to impart excellent wear properties to the magnetic recording member. In that patent, a hard finish layer was formed by the chromium oxide obtained by using the soft vacuum of approximately $10^{-4}$ Torr with oxygen in the vacuum to develop the chromium oxide hard finish layer. Thus a separate hard finish protective layer 18 is not required using a magnetic coating taught by Alstead et al.

Figure 3:
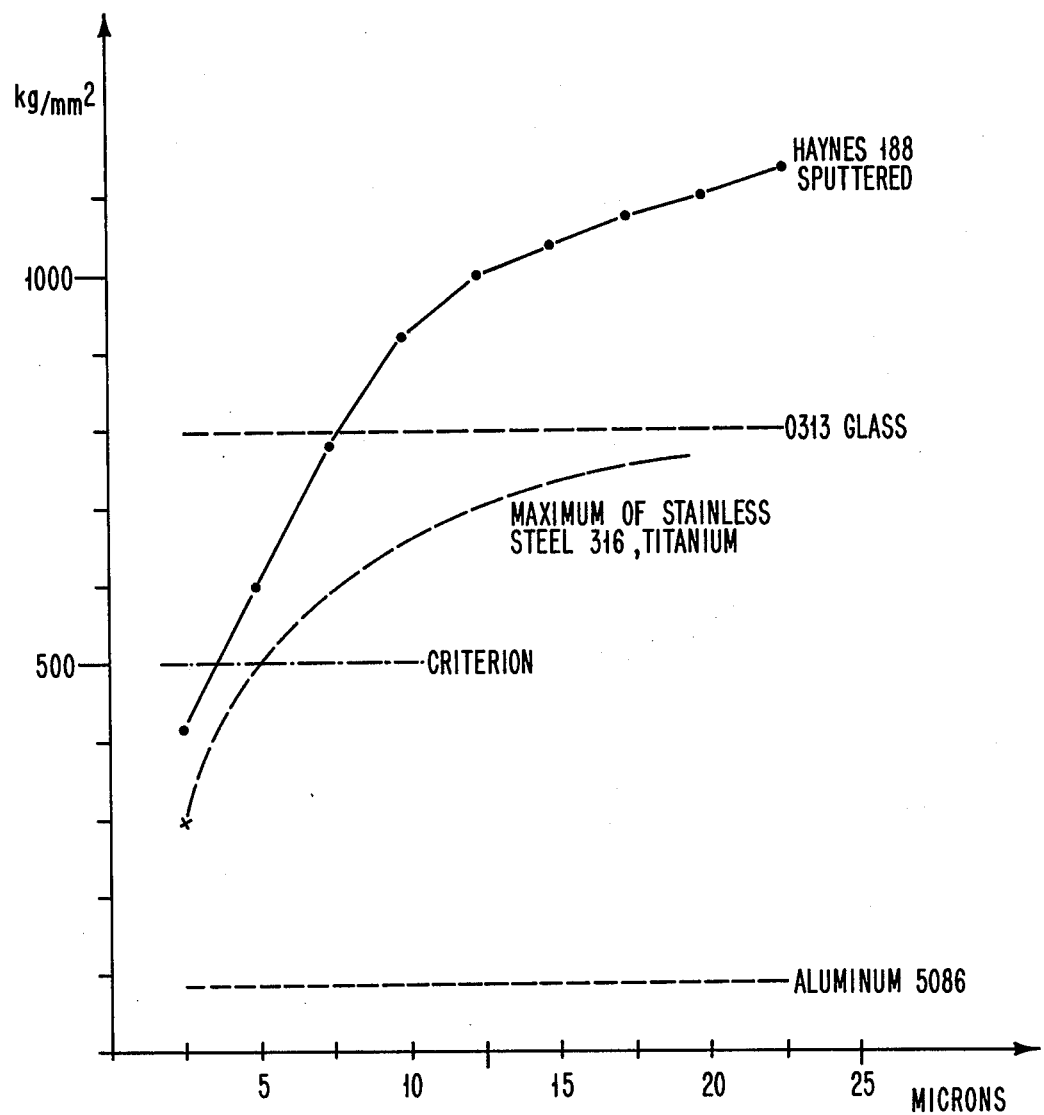
FIG. 3 is a curve diagram showing the representative hardness of various thickness of thin film materials.

If, however, the magnetic layer is formed from iron or cobalt material or an alloy thereof, the protective layer 18 is useful to prevent damage to the magnetic layer 16 by the head 20. The protective layer 18 can be a layer of rhodium. The deposition of a thin layer of rhodium as the protective layer 18 on the external surface of the magnetic layer 16 presents certain problems. The common practice is to deposit this layer of the rhodium to prevent the loss of data information in the event the head 20 contacts the magnetic recording member. One problem of the rhodium is that the magnetic transducer head is thereby spaced from the magnetic layer 16 so that the strength of the signals recorded on the magnetic layer by the magnetic transducing head 20 or reproduced from the magnetic layer by the head 20 becomes reduced. The deposition can be by electroplating at any suitably rhodium solution at a temperature of approximately 45° C for a period of time of approximately one to five minutes. Or the protective layer of rhodium can be vacuum deposited by sputtering for instance. In the sputtering of rhodium, the substrate with the magnetic layer 16 is inserted in a vacuum chamber having an Argon pressure of approximately $3 \times 10^{-3}$ Torr. The rhodium layer is then deposited at a rate of approximately 8 Angstroms per second with a substrate temperature of approximately 200° C. A suitable thickness of rhodium for the protection of the magnetic layer 16 is approximately 500 Angstroms. The thickness dimension of the thin film of the clad layer 12 using the cobalt based alloy of the present invention is important since the clad layer must protect the aluminum substrate from damage when the head contacts the magnetic recording member. FIG. 3 depicts the effective hardness of various clad materials as a function of thickness. These are compared to the preferred aluminum-magnesium alloy substrate and a glass material. The clad layer 12 of the cobalt based alloy is shown to have a hardness property greater than that of stainless steel or titanium alloys. The hardness values were obtained by using 7.5 grams of the test load on a Knoop hardness tester.

As is disclosed in FIG. 3, the aluminum alloy substrate commonly used for the rotating disk magnetic recording members is quite soft, on the order of 100 kilograms per square millimeter. As a comparison, a glass material used for the substrate 10 has a hardness approximately 800 kilograms per square millimeter. The aluminum alloy, however, is more commonly used because of its light weight and the ease with which the substrate can be manufactured. But the aluminum alloy can be more easily damaged than the glass substrate for instance. An optimum substrate would have the hardness properties of the glass while retaining the lightness of the aluminum alloy. The aluminum substrate is given the hardness properties of glass and beyond by the deposition of the cobalt based alloy as the clad layer 12 of the present invention. As disclosed in FIG. 3, the cobalt based clad layer has a hardness that is dependent upon the thickness deposited. At approximately 2.5 microns, the cobalt based alloy has a hardness of approximately 400 kilograms per square millimeter. As the thickness increases, the hardness of the cobalt based alloy also increases even beyond that of the glass substrate. At approximately 12.5 microns, the cobalt based alloy has a hardness of approximately 1000 kilograms per square millimeter. The clad layer 12 is preferably deposited to a thickness of 40,000 Angstroms to provide a hardness of approximately 500-600 kilograms per square millimeter. It can be concluded from FIG. 3 that for the hardness criteria of 500 kg/mm$^2$, the thickness requirements is significantly smaller for Haynes alloy 188 (3.5 microns) that for stainless steel or titanium (5.5 microns).

The principles of the present invention have now been made clear in an illustrative embodiment. There will be immediately obvious to those skilled in the art many modifications of structure, arrangement, proportions, elements, materials and components used in the practice of the invention. According to the present invention, the clad layer 12 comprises a cobalt based alloy of a prescribed thickness to prepare an aluminum alloy substrate for the subsequent magnetic layer. The selection of a particular aluminum alloy for the substrate 10 as well as the material used for the magnetic layer 16 and the presence and material of the undercoat layer 14 and the protective layer 18 is well within the ability of the person well skilled in the magnetic recording and deposition arts. The appended claims, are, therefore, intended to cover and embrace any such modifications, within the limits only of the true spirit and scope of the invention.

What is claimed is:

1. In a magnetic recording structure comprising a non-magnetic substrate, an undercoat layer deposited on the substrate, and a layer of a magnetic material deposited on the undercoat layer, the improvement wherein at least a film portion of the undercoat layer is made of an alloy consisting essentially of from 18–30% chromium, from 8–30% nickel, from 8–18% tungsten with the balance being cobalt.

2. A magnetic recording structure as defined in claim 1 wherein said cobalt based alloy consist essentially of up to 10% iron, from 0.01–0.35% carbon, up to 1% silicon from 0.02–0.2% lathanumum, with the balance to 61% maximum being cobalt.

3. A magnetic recording structure as defined in claim 1 wherein said alloy consists essentially of approximately 38% Co, approximately 24% Ni, approximately 22% Cr, approximately 14.5% W, with the remainder being Fe, C, Si and La.

4. A magnetic recording structure as defined in claim 1 wherein said alloy consists essentially of from 9–11% Ni, from 19–21% Cr, from 14–16% W, up to 3% Fe, from 0.05–0.15C, up to 1% Si, from 1–2% Mn, balance Co.

5. A magnetic recording structure as defined in claim 1 wherein said alloy consists essentially of from 35–50% Co, from 10–22% Ni, from 18–25% Cr, from 13–16W, with the balance comprising minor portions of any or all of Fe, Si, C, La and Mn, 6. In a recording carrier for a layer of magnetic material comprising a non-magnetic substrate and an undercoat layer deposited on said substrate, the improvement wherein at least a film portion of said undercoat layer is made of an alloy consisting essentially of from 18-30% chromium, from 8-30% nickel, from 8-18% tungsten, up to 10% minor constituents, with the balance being cobalt.

7. A recording carrier as defined in claim 6 wherein a second film portion of said undercoat layer is made of a material selected from the group consisting of chromium and titanium.

8. A recording carrier as defined in claim 6 wherein said undercoat layer comprises at least two separate film layers, each made of said alloy.

9. A recording carrier as defined in claim 6 wherein said alloy consists essentially of from 18-30% chromium, from 8-30% nickel, from 8-18% tungsten, up to 10% Iron, from 0.01-0.35% carbon, up to 1% Silicon, from 0.02-0.2% lathanum with the balance to 61% maximum being cobalt.

10. A recording carrier as defined in claim 6 wherein said alloy consists essentially of approximately 38% Co, approximately 24% Ni, approximately 22% Cr, approximately 14.5% W, with the remainder being Fe, C, Si and La.

11. A recording carrier as defined in claim 6 wherein said alloy consists essentially of from 9-11% Ni, from 19-21% Cr, from 14-16% W, up to 3% Fe, from 0.05-0.15 C, up to 1% Si, from 1-2% Mn, balance Co.

12. A recording carrier as defined in claim 6 wherein said alloy consists essentially of from 35-50% Co, from 10-22% Ni, from 18-25% Cr, from 13-16% W, with the balance comprising minor portions of any or all of Fe, Si, C, La and Mn.

* * * * *